United States Patent
Darling et al.

(10) Patent No.: US 8,269,100 B2
(45) Date of Patent: Sep. 18, 2012

(54) HYBRID SOLAR CELLS VIA UV-POLYMERIZATION OF POLYMER PRECURSOR

(75) Inventors: Seth B. Darling, Chicago, IL (US);
Sanja Tepavcevic, Chicago, IL (US);
Tijana Rajh, Downers Grove, IL (US);
Nada Dimitrijevic, Downers Grove, IL (US); Steven J. Sibener, Chicago, IL (US)

(73) Assignee: UChicago Argonne, LLC, Chicago, IL (US)

( * ) Notice: Subject to any disclaimer, the term of this patent is extended or adjusted under 35 U.S.C. 154(b) by 639 days.

(21) Appl. No.: 12/489,001

(22) Filed: Jun. 22, 2009

(65) Prior Publication Data
US 2010/0078066 A1    Apr. 1, 2010

Related U.S. Application Data

(60) Provisional application No. 61/101,531, filed on Sep. 30, 2008.

(51) Int. Cl.
*H01L 31/00* (2006.01)
*H01L 21/00* (2006.01)

(52) U.S. Cl. .......... 136/263; 438/82
(58) Field of Classification Search ........ 136/256, 136/263; 257/E51.015, E51.027; 438/82
See application file for complete search history.

(56) References Cited

U.S. PATENT DOCUMENTS

| 2006/0263922 | A1* | 11/2006 | Levitsky et al. | 438/48 |
| 2008/0011351 | A1* | 1/2008 | Diau et al. | 136/256 |
| 2008/0041447 | A1* | 2/2008 | Tseng et al. | 136/263 |

OTHER PUBLICATIONS

Natarajan et al., Thin Solid Films, 496 (2006) 606-611.*

* cited by examiner

*Primary Examiner* — Jennifer Michener
*Assistant Examiner* — Eli Mekhlin
(74) *Attorney, Agent, or Firm* — Foley & Lardner LLP

(57) ABSTRACT

A hybrid photovoltaic cell comprising a composite substrate of a nanotube or nanorod array of metal oxide infiltrated with a monomer precursor and subsequently polymerized in situ via UV irradiation. In an embodiment, the photovoltaic cell comprises an electron accepting $TiO_2$ nanotube array infiltrated with a photo-sensitive electron donating conjugated polymer. The conjugated polymer may be formed in situ through UV irradiation polymerizing a monomer precursor such as 2,5-diiodothiophene (DIT).

11 Claims, 10 Drawing Sheets

HYBRID SOLAR CELLS VIA UV-POLYMERIZATION OF POLYMER PRECURSOR

CROSS REFERENCE TO RELATED PATENT APPLICATIONS

The present application claims priority to U.S. Provisional Patent Application No. 61/101,531, filed Sep. 30, 2008 incorporated herein by reference in its entirety.

STATEMENT OF GOVERNMENT INTEREST

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

FIELD OF THE INVENTION

The present invention relates generally to the field of photovoltaic cell devices. More particularly, the present invention relates to hybrid organic-inorganic photovoltaic cell devices and methods of fabricating such devices.

BACKGROUND OF THE INVENTION

This section is intended to provide a background or context to the invention that is, inter alia, recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Acquiring sufficient supplies of clean energy is presently a critical challenge. Sunlight is a plentiful carbon neutral source that may be harnessed to partially satisfy this need. While conventional single crystal inorganic semiconductor devices can convert more than twenty percent of received solar energy to electric power, their high cost and relatively complicated technology limit large scale industrial and household application. Accordingly, there is interest in developing solar cells using alternative materials.

Organic materials represent a class of alternative materials that may be applicable to the development of solar cells that are relatively simple and cost efficient. The opportunities for using organic photovoltaics (OPV) are considerable and could lead to low-cost, lightweight, ultrafast optoelectronic response, easily processable, large area, flexible solar cells. Hybrid devices incorporating both organic and inorganic materials can reap the advantages of both classes of materials.

Hybrid solar cells have been developed in the past decade as a promising alternative for traditional silicon-based solar cells. A wide band gap metal oxide, for example, titanium dioxide ($TiO_2$), sensitized by an organic semiconductor, dye molecule, or quantum dots offers the promise of low-cost, large-area conversion of solar energy to electricity. However, the nano-scale morphology of such devices is an important element of their performance. For instance, a simple layered (planar heterojunction) donor-acceptor device structure yields cells with poor efficiency due to the limited interfacial area, charge carrier recombination, and overly thin layers necessitated by exciton diffusion distances (5-20 nm). Enlargement of the interfacial area is accomplished in dye-sensitized solar cells, in which a highly porous film of titanium dioxide nanoparticles is covered with a monolayer of a metal-organic sensitizer that absorbs visible light. Although energy conversion efficiencies can exceed ten percent in such devices, the necessity of a liquid electrolyte to accomplish regeneration of the oxidized dye usually calls for elaborate sealing techniques that have hindered commercialization. Further, conventional bulk heterojunction (BHJ) solar cells consist of randomly structured contact between the donor and acceptor layers; limitations of this disordered configuration include non-ideal domain length scales, charge trapping at bottlenecks, and dead-ends in the conducting pathways to the electrodes.

In contrast, highly ordered, vertically oriented, crystalline oxide semiconductor (such as $TiO_2$) nanotube arrays fabricated by potentiostatic anodization provide excellent electron percolation pathways for direct charge transfer between interfaces. This material architecture offers a large internal surface area without a concurrent degradation of structural order. Further, this architecture offers the ability to influence the absorption and propagation of light through the architecture by precisely designing and controlling the architectural parameters including nanotube pore size, wall thickness, and length.

One approach for making inexpensive inorganic-organic hybrid photovoltaic (PV) cells is to fill nanostructured titania films with solid organic hole conductors such as conjugated polymers. These compounds can function as light-absorbing species and inject electrons into the conduction band of the n-type semiconductor, while at the same time they conduct the holes to the cathode. For example, oligothiophenes and polythiophenes (PT), in particular, have strong potential in the fields of electronics, sensors, solar cells, and displays because of their superior thermal and environmental stability as well as their interesting electronic properties. In particular, poly(3-hexylthiophene) (P3HT) is considered advantageous due to its large absorption coefficient (close to the maximum photon flux in the solar spectrum) and its high hole mobility of 0.1 $cm^2$ Vs in its ordered, regioregular form, which is among the highest for polymeric semiconductors. Other types of conjugated polymers can also be used.

Nanotube films offer a distinct advantage over nanoparticle films in that they facilitate charge carrier transport. The electrons in particulate $TiO_2$ films are more susceptible to loss at grain boundaries than those in nanotube $TiO_2$ films. The relative roles of crystal structure and surface defects also must be taken into consideration in comparing $TiO_2$ tubes and particles in the context of their interaction with polymers. In addition to the improved electron mobility associated with ordered metal oxide nanostructures, the hole mobility of the conjugated polymer may be enhanced in the direction normal to the substrate by infiltrating the polymer into a nanotube architecture as a result of alignment of the polymer chains along the walls of the pores. Compared to the more commonly used ruthenium-based dyes, conjugated polymers are relatively inexpensive as sensitizers. In films sensitized by molecular dyes, a thickness of nanostructured $TiO_2$ film of at least 10 µm is necessary to harvest the maximal amount of incident photons. On other the hand, for a polymer with a high absorption coefficient such as P3HT, a film several hundred nanometers in thickness is sufficient to optimally harvest incident sunlight. Thinner films translate into shorter pathways for the charge carriers and, hence, less non-geminate recombination.

The infiltration of the polymer into the nanostructured metal oxide is of particular importance for optimizing the performance of these hybrid devices. Past efforts to develop solar cells using conjugated polymers have employed wet processing deposition techniques such as spin coating, dip coating, drop casting, doctor-blading, ink-jet printing, and screen printing. However, because polymers suffer a loss of conformational entropy when they are confined in a channel that has a radius less than their radius of gyration, filling the pores with a polymer has been thought to be a challenge due to the possibility of the polymer chains clogging the pores of the nanotubular electrode. These deficiencies may be avoided by producing oligothiophenes and polythiophene directly within a nanostructured architecture instead of using presynthesized polymer. Solventless direct deposition approaches such as plasma polymerization, laser-induced chemical vapor deposition, as well as X-rays, electrons, and ion-induced synthesis in ultra-high vacuum (UHV) conditions have also been attempted. However, these approaches, in general, have insufficient reaction specificity to generate reactive species without fragmentation of the monomer structure, resulting in defect incorporation in the final product.

SUMMARY OF THE INVENTION

The efficiency of OPV systems, which is currently about five percent, lags far behind inorganic counterparts. However, to date, no step in the photon-to-electron conversion process has been optimized. Unlike conventional inorganic solar cells, in OPVs adsorbed photons create bound pairs of charges called excitons. To be useful, the excitons must diffuse to the donor/acceptor (D/A) interface where charge separation occurs. The power conversion efficiency of these devices is substantially determined by: (1) photon adsorption/exciton generation, (2) exciton diffusion to D/A interface, (3) charge separation at the D/A interface, and (4) carrier diffusion to the electrodes. The method of the present invention aims to improve the efficiency of all of these parameters, thereby improving the overall performance of the photovoltaic device.

Photon adsorption/exciton generation is improved by employing a material having an optical excitation energy gap approximately equal to the incident photon energy. The largest terrestrial solar photon flux is in the range of about 1.3-2.9 eV. Polythiophene typically has gaps of about 2 eV. Further, the hole mobility of polymers with thiophene backbones is among the highest of organic materials. Previous efforts to create a composite of polythiophene and $TiO_2$ have failed because the long organic molecules cannot fully infiltrate the porous network. Here 2,5-diiodothiophene, a small molecule, is incorporated into the pores to overcome this difficulty. This particular molecule can be polymerized with ultraviolet light in situ to form oligothiophene chains. This technique is also applicable to other systems, including thiophenes, vinylenes, phenylenes, anilines, quinolines, quinoxalines, thienothiophenes, and other conjugated polymer precursors. Thus, this methodology overcomes the previous obstacle of incomplete filling of the pores. The nanostructure of the polythiophene-$TiO_2$ layer substantially improves the power conversion efficiency of these solar cells.

With regard to the second factor, due to restrictions associated with exciton diffusion to the D/A interface, the active region of a traditional OPV device is about 10-20 nm, so that a traditional device is constructed of very thin layers, resulting in poor photon absorption efficiency. One preferred form uses a layer of electron-accepting $TiO_2$ fabricated using electrochemical techniques. However, nanotube and nanorod structures comprising other materials can also be employed, including those formed from other metal oxides. This layer has a continuous network of nanoscopic pores that is filled with an organic electron-donating material such as polythiophene to create a composite where any point in the entire volume of the material is within an exciton diffusion length of a D/A interface.

The charge separation at the D/A interface is improved by the large electron affinity of $TiO_2$. The carrier diffusion to the electrodes is improved by providing a continuous, interpenetrating composite material that has clearly defined pathways from the interior of the active region to the electrodes. This feature provides an efficient pathway for the electrons and holes to travel from the D/A interface to their respective electrodes.

In an embodiment of the present invention, a hybrid photovoltaic cell is fabricated by immersing a nanotubular $TiO_2$ substrate in a 2,5-diiodothiophene (DIT) monomer precursor solution and then irradiating the substrate with ultraviolet (UV) light to polymerize the monomer precursor. The resulting composite photovoltaic cell unexpectedly yields a photocurrent density as high as 5 $\mu A/cm^2$ under a non-ideal backside-illumination with 620 nm light. By using this relatively simple method of in situ UV polymerization that couples the conjugated polymer to the $TiO_2$ surface, enhanced exciton separation and charge carrier mobility of the photoactive layer are accomplished.

The present invention provides a technique for deposition/infiltration of conjugated polymer into densely ordered nanotube or nanorod arrays. Accordingly, the performance of solar cell devices is enhanced by using in situ ultra-violet (UV) polymerization of polythiophene, compared to conventional infiltration of pre-synthesized P3HT.

These and other advantages and features of the invention, together with the organization and manner of operation thereof, will become apparent from the following detailed description when taken in conjunction with the accompanying drawings, wherein like elements have like numerals throughout the several drawings described below.

DETAILED DESCRIPTION OF PREFERRED EMBODIMENTS

Figure 1:
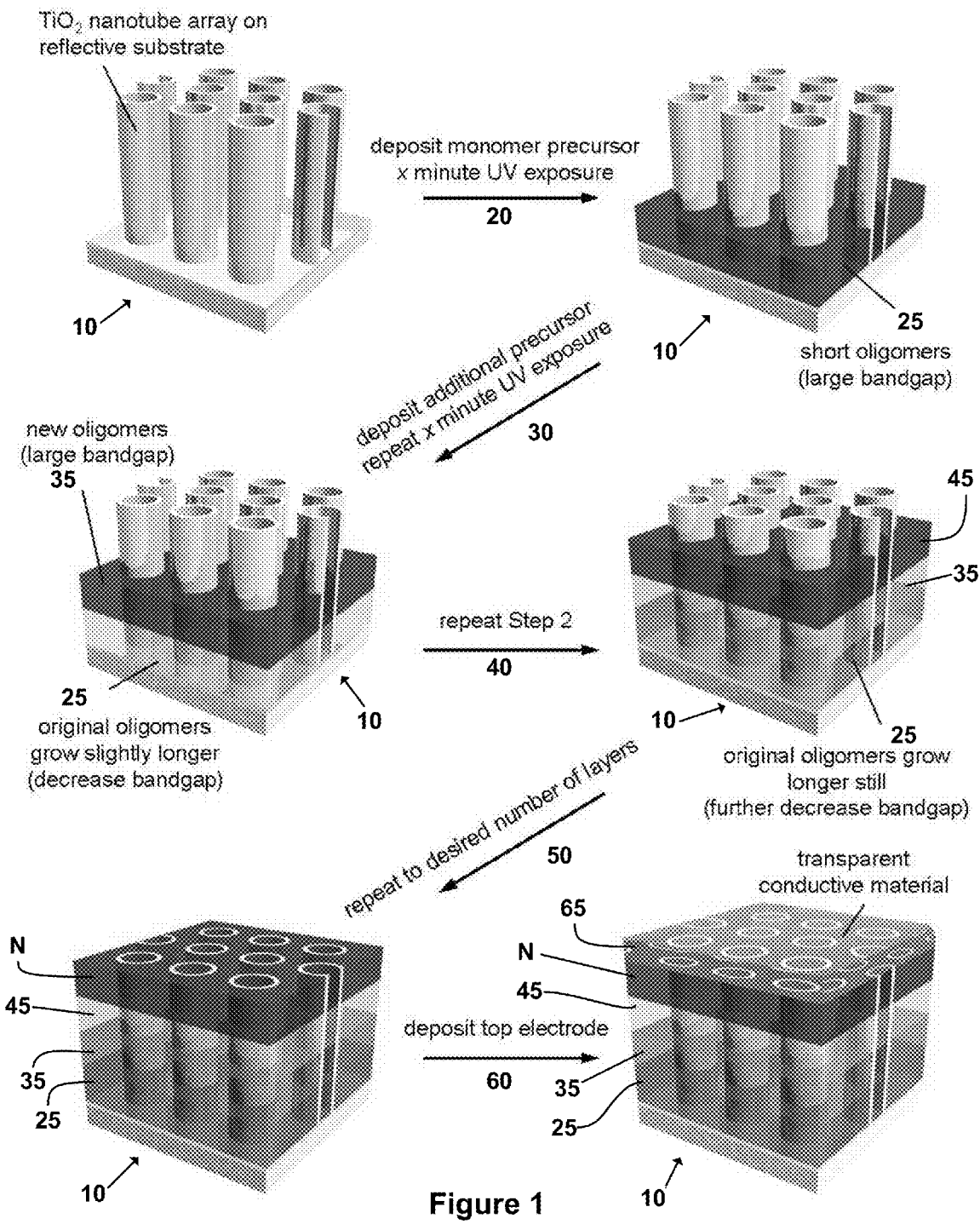
FIG. 1 illustrates an in situ UV polymerization process for packing a nanotube array with an ordered assembly of different-length oligothiophenes adapted to absorb various wavelengths of incident light.

Performance of hybrid cells can be increased by improving their light-harvesting capability through the construction of a rainbow solar cell according to the process depicted in FIG. 1. A nanotube or nanorod array packed with an ordered assembly of different-length conjugated oligomers, such as oligothiophenes, could provide enhanced light-harvesting capability. As white light enters the cell, shorter oligothiophenes (larger band gap) absorb the portion of the incident light with smaller wavelengths. Longer wavelength light, transmitted through the initial layer, is absorbed by subsequent layers, and so on. By using in situ UV polymerization, a gradient of different length oligothiophenes can be readily created by varying UV exposure time. By constructing an ordered gradient of conjugated oligomers/polymer, the effective capture of incident light can be increased.

A rainbow solar cell can be constructed, for example, according to the process of FIG. 1 by providing a substrate 10 comprising a nanotube array and successively depositing layers of monomer precursor and irradiating the substrate 10 to polymerize the monomer precursor. In an embodiment, the nanotube array comprises a metal oxide. In a preferred embodiment, the metal oxide comprises TiO$_2$. A first layer 25 of monomer precursor is deposited on the substrate 10 and irradiated with UV light at step 20. A resulting layer of short oligomers in the first layer 25 having a relatively large bandgap is thus disposed on the substrate 10. A second layer 35 of monomer precursor is deposited over the first layer 25 and irradiated with UV light at step 30. Accordingly, the oligomers comprising the first layer 25 grow longer, decreasing the bandgap. Simultaneously, a layer of short oligomers is formed in the second layer 35. A third layer 45 of monomer precursor is deposited over the second layer 35 and irradiated with UV light at step 40. The irradiation further lengthens the oligomers of the first layer 25, lengthens the oligomers of the second layer 25, and forms short oligomers in the third layer 45. This process may be repeated, depositing successive layers of monomer and irradiating the substrate 10 with UV light at step 50 until N number of desired layers is achieved. An electrode 65 can be deposited over layer N in step 60.

By growing a polymer inside/around the nanotubes or nanorods, as opposed to infiltrating with a polymer, more complete filling of the nanoarray is achieved because the small molecule monomer more easily penetrates into the full volume of the structures. In a particular embodiment, the nanotubes may comprise TiO$_2$. Because TiO$_2$ absorbs UV light efficiently, the metal oxide nanotube network serves as the primary conduit for the light energy to enter the precursor molecules. Therefore, coupling between the resulting polymer and the oxide surface is encouraged because the UV light preferentially enters through the TiO$_2$.

Polymerization of the precursor is more easily achieved by starting with smaller precursors. When the starting molecules for UV polymerization are 2T or 3T, the corresponding decrease in orientational freedom of the molecules has a negative effect on the ease of polymerization and the structural order of the product.

In another embodiment, a hybrid photovoltaic cell can be fabricated by immersing a nanotubular substrate in a precursor. In a particular embodiment, the nanotubular substrate comprises TiO$_2$ and the monomer precursor comprises a solution of 2,5-diiodothiophene (DIT). However, other substrate materials may be used, including nanotubes or nanorods formed from various metal oxides. Similarly, one or more precursors in combination with DIT, or in the alternative to DIT, may be used, including precursors comprising: thiophenes, vinylenes, phenylenes, anilines, quinolines, quinoxalines, thienothiophenes, and other conjugated polymer precursors. Following immersion, the substrate is irradiated with ultraviolet (UV) light. The selective UV photodissociation of the C—I bond produces monomer radicals with intact π-ring structure that further produce longer oligothiophene/polythiophene molecules. Complete photoluminescence quenching upon UV irradiation suggests coupling between radicals created from DIT and at the TiO$_2$ surface via a charge transfer complex. Coupling with the TiO$_2$ surface likely improves UV-PT crystallinity and π-π stacking; flat photocurrent values show that charge recombination during hole transport through the polymer is negligible. A non-ideal backside-illuminated setup under illumination of 620 nm light unexpectedly yields a photocurrent density as high as 5 µA/cm$^2$.

The selective UV photodissociation of the C—I bond (λ=250-300 nm) in the precursor molecule produces monomer radicals with intact π-ring structure. Because the C—I bonds are present at the ends of the reaction coupling products, further photodissociation can take place forming oligomeric and polymer species that can couple to and self-assemble on the surface of TiO$_2$ nanotubes.

To create high-quality conjugated polymers for photovoltaic devices, defects such as fragmented monomer structure, mislinking of monomer units (α-β and β-β coupling), conformational disorder, and cross-linking of polymer chains should be minimized. It has been reported that in situ polymerization can be used to produce covalently surface-grafted regio-random conjugated polythiophene inside the TiO$_2$ nanotubes 110. Using this method, P3HT was synthesized directly from the initiator group using 3-hexylthiophene as the monomer and FeCl$_3$ as a chemical oxidant. The organic monolayer bound on the titania surface containing thiophene moieties was used to initiate in situ polymerization. Surface-initiated in situ polymerization achieved better interface contact, larger surface coverage, and more complete filling compared with a nanoporous structure infiltrated by polymer synthesized outside the network; however, this methodology created regio-random polythiophene In contrast, by using in situ UV polymerization, monomer units preferentially connect via α-α coupling. Upon absorption of UV photons, C—I bonds of the diiodothiophene precursor molecule selectively dissociate into a thienyl radical and iodine atoms. The excess kinetic energy imparted to the photogenerated radicals is rapidly quenched via collisions in the condensed phase. During this collision process, some of the photogenerated radicals may react with unreacted monomers, making dimers that can be further activated by photons and involved in reactions forming oligomers and polymers, denoted as UV-PT. Oxygenated defects are avoided by using an inert argon environment (water adsorption on the substrate is negligible at room temperature).

Various aspects of the present invention will now be further explained in the following illustrative example. However, the present invention should not be construed as limited thereby. One of ordinary skill in the art will understand how to vary the exemplified systems and methods to obtain the desired results. The following nonlimiting example is illustrative of various aspects of the invention.

EXAMPLE

With reference to FIGS. 1-9, an embodiment of a photovoltaic cell 10 according to the present invention was fabricated as follows. A vertically oriented $TiO_2$ nanotube array 100 was formed on a conductive transparent electrode ITO-coated glass substrate 140. The substrates were cleaned by subsequent 15 minute sonications in the following solvents: sodium-dodecyl sulfonate, DI water, acetone and isopropyl alcohol. A Ti film 150 about 1 μm thick was formed on the ITO-coated glass substrate 140 by sputter deposition. To improve adhesion of the initial layer of the Ti film 150 onto the ITO-coated glass substrate 140, the first 100 nm of the Ti film 150 were grown at a relatively slow deposition rate (0.5 Å/s) and the remainder of the Ti film 150 was grown at 2.3 Å/s.

The $TiO_2$ nanotube array 100 comprising a plurality of $TiO_2$ nanotubes 110 was formed by potentiostatic anodization of the Ti film 150 in an electrolyte containing 0.27 M $NH_4F$ and 5% deionized $H_2O$ dissolved in formamide. To grow 660 nm-long $TiO_2$ nanotubes 110 with 30 nm inner diameter, potentiostatic anodization was performed for 8 minutes in a two-electrode system with the titanium film as the working electrode and platinum mesh as the counter electrode under constant potential 15 V and a temperature of 22° C. and with a 50 mA current limit. The as-anodized samples were ultrasonically cleaned in deionized water to remove surface debris and subsequently crystallized by annealing in an oxygen atmosphere at 450° C. for 4 hours with heating and cooling rates of 1° C./min.

The resulting length of the $TiO_2$ nanotubes 110, which is the thickness of the $TiO_2$ layer, may be estimated from the position of interference fringes present in the transmission spectra depicted in FIGS. 1A and 1B due to multiple reflections on the interfaces between media with different thicknesses and refractive indices. The equation $1/\lambda m = m\{1/(4dn)\}$ gives the dependence of the reciprocal value of the wavelengths ($1/\lambda m$) on the order (m) of extremes (maxima and minima) in transmittance from longer to shorter wavelengths. In the above equation, d is the thickness of the film in nm and n is the refractive index of $TiO_2$. Using an average value for the refractive index of $TiO_2$ anatase crystal structure, n=2.52, the slope of the data displayed in FIGS. 1A and 1B indicates that d=660 nm.

Figure 2A:
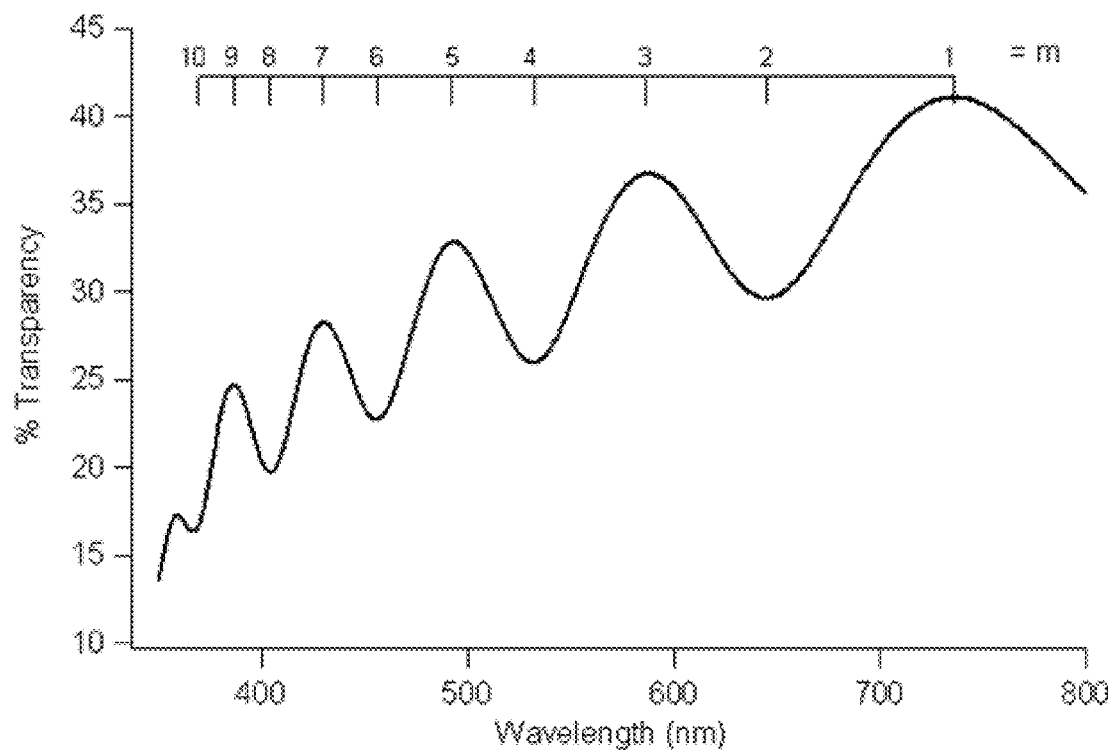
FIG. 2A is a fringe pattern of the transmission spectrum of a thin $TiO_2$ film on an ITO substrate.
Figure 2B:
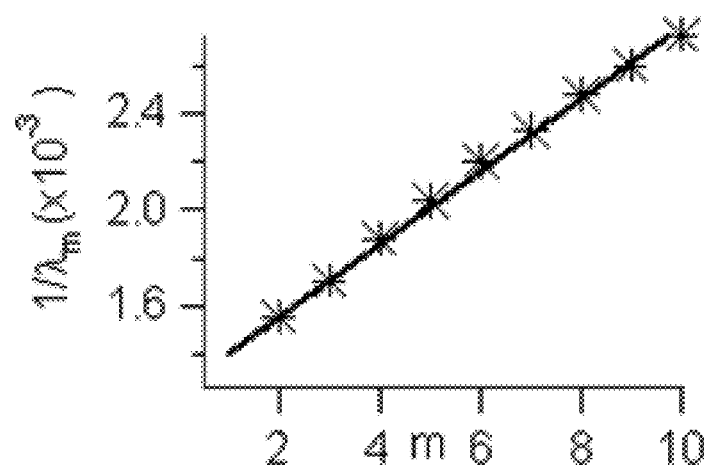
FIG. 2B depicts the data extracted from the peaks in FIG. 2A.
Figure 3A:
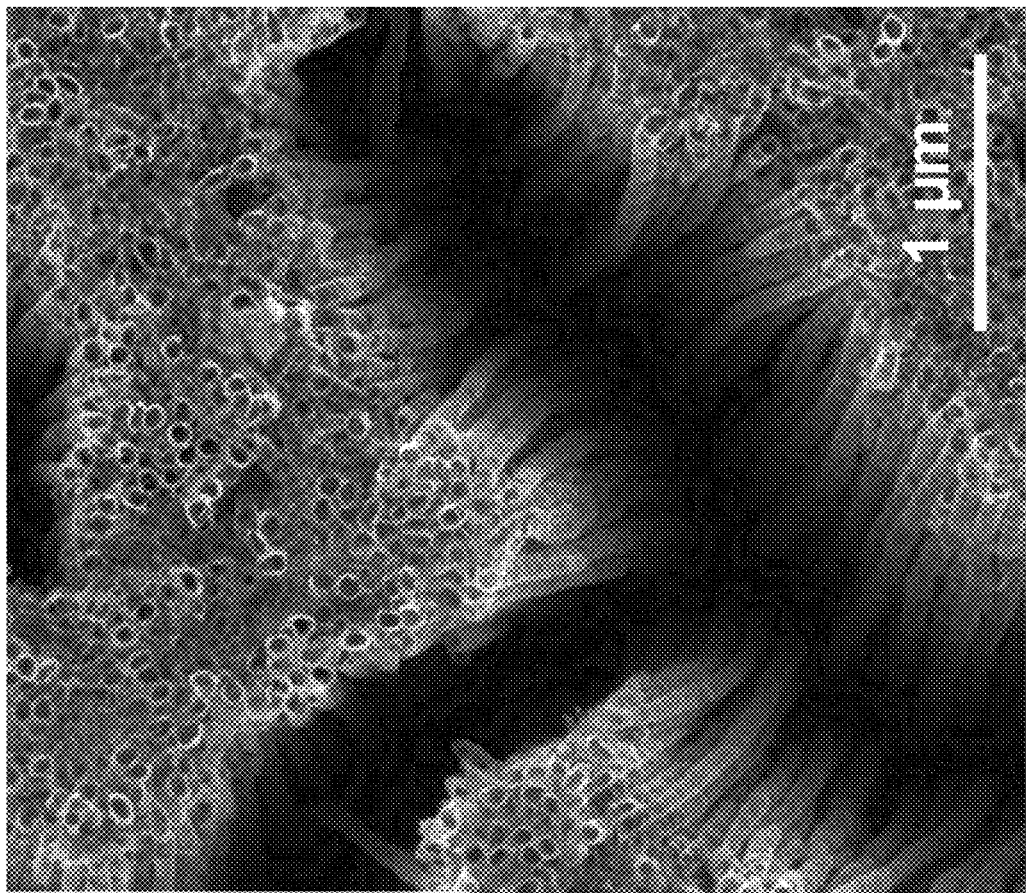
FIG. 3A is a field emission scanning electron microscopy image of the $TiO_2$ nanotube array top surface after annealing.
Figure 3B:
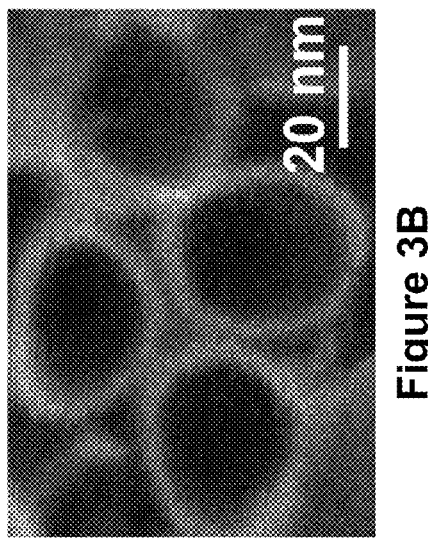
FIG. 3B is an enlarged view of the $TiO_2$ nanotube array of FIG. 3A showing an nanotube inner diameter of about 30 nm and a nanotube wall thickness of about 5 nm.

The morphology of the anodized samples was studied using a JEOL JSM-6300 field emission scanning electron microscope (FESEM). As depicted in FIGS. 2A and 2B, the nanotubes of the resulting $TiO_2$ nanotube array 100 had an average inner diameter of about 30 nm and a wall thickness of about 5 nm. Of note, the radius of the nanotubes of the $TiO_2$ nanotube array 100 is similar to the exciton diffusion distance in organic semiconductors. Furthermore, this radius can be varied by adjusting the anodization conditions.

The $TiO_2$ nanotubes 110 comprising the $TiO_2$ nanotube array 100 were infiltrated with a DIT monomer precursor by either drop casting or overnight immersion in 35 g/L solution, followed by in situ UV polymerization (ITO/Ti/$TiO_2$(NT)/UVPT). The deposited monomer film was irradiated for 15 minutes with a collimated UV beam from a E300BUV Cermax lamp (PerkinElmer) in an argon environment. Irradiation intensity was controlled to be 0.5 W/cm² by using a lamp current of 10 A and a lamp-sample distance of 45 mm. To prevent substrate heating during UV irradiation, the infrared radiation emitted from the lamp was removed with a water filter.

Figure 4:
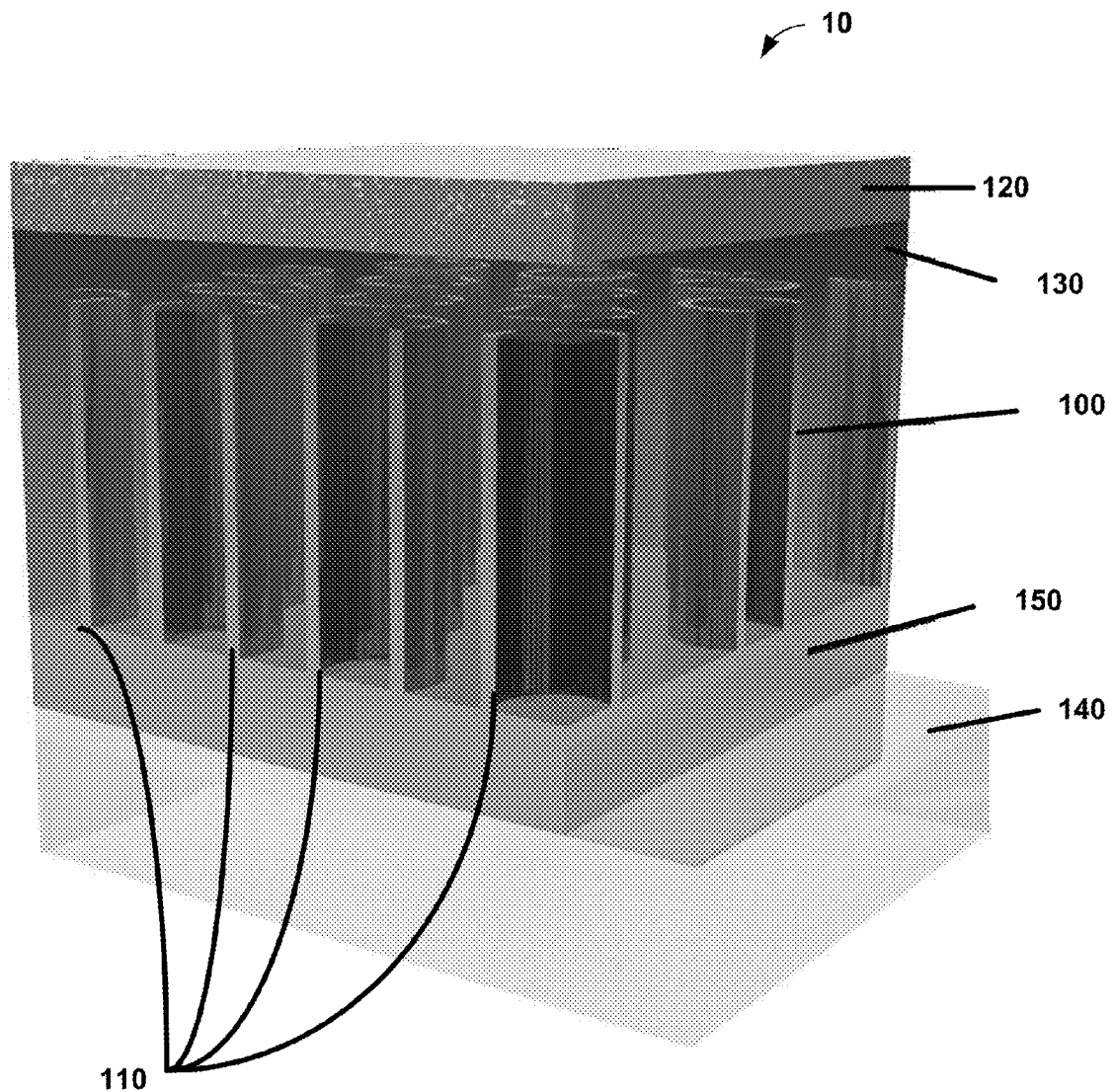
FIG. 4 shows a configuration of a backside-illuminated heterojunction solid state solar cell constructed of UV-polymerized polythiophene self-assembled within a $TiO_2$ nanotube array according to an embodiment of the present invention.

For comparison, a reference device was fabricated by infiltrating with P3HT by drop casting 1 mL of 20 g/L solution (ITO/Ti/$TiO_2$(NT)/P3HT). As shown in FIG. 4, a top electrode 120 was deposited above the $TiO_2$ nanotube array 100. To prevent electrons in the $TiO_2$ nanotubes 110 from reaching the top electrode 120 and short-circuiting the device, an overlayer 130 of P3HT 30 nm thick was spin-coated above $TiO_2$ nanotube array 100. The overlayer 130 was also applied to the reference device. The top electrode 120 comprised a 30 nm-thick Ag film sputter deposited onto the device.

Solar cell performance increased with an increasing amount of polymer embedded in the $TiO_2$ nanotubes 110—contrary to prior studies on P3HT infiltrated into a mesoporous $TiO_2$ film. To maximize the infiltration of the monomer molecules, instead of drop casting monomer solution onto the $TiO_2$ nanotube substrate 100, the $TiO_2$ nanotubes 110 were immersed overnight in the monomer solution. For P3HT, the optimal filling of the $TiO_2$ nanotubes 110 was achieved after annealing a film at 225° C. for 15 min.

Figure 5:
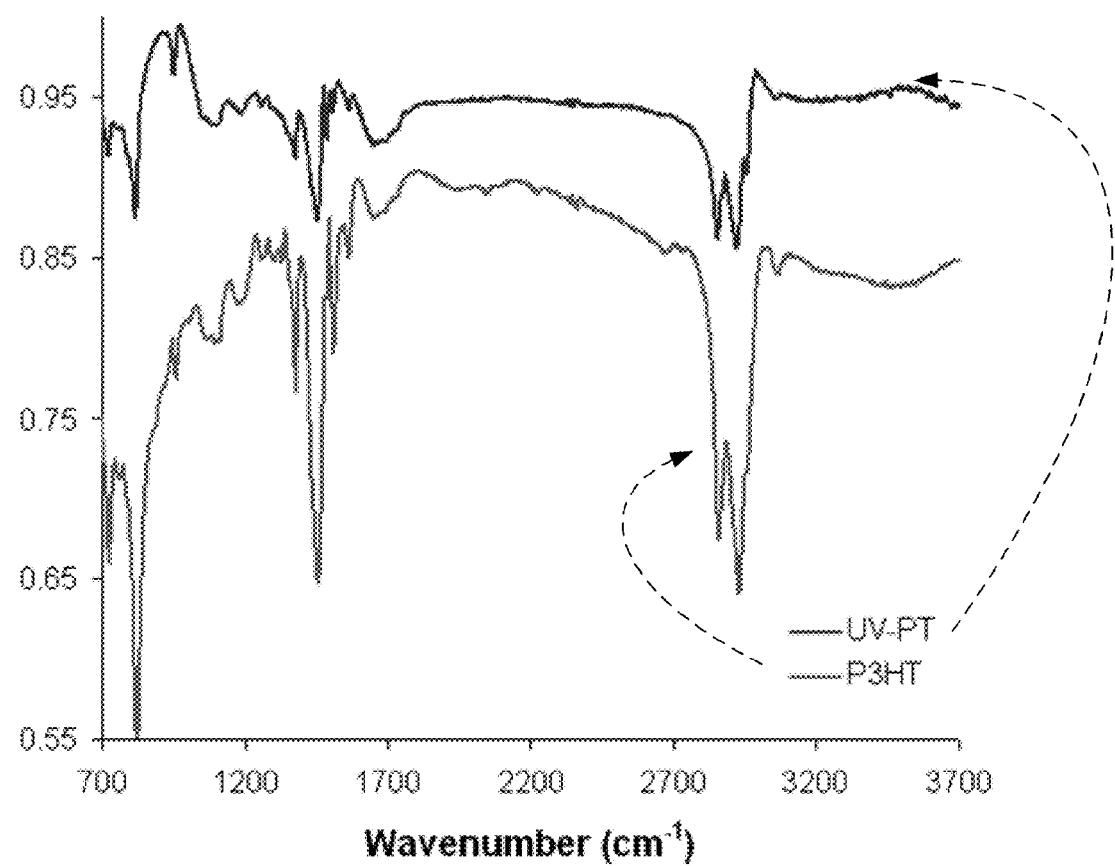
FIG. 5 shows attenuated total reflection Fourier transform infrared spectra of UV-polymerized polythiophene and P3HT on $TiO_2$/ITO substrate according to an embodiment of the present invention.

The molecular structures of the photochemically synthesized polymers were investigated with attenuated total reflectance (ATR) Fourier-transform infrared (FT-IR) spectroscopy using a Vertex 70 (Bruker) spectrometer and a 20×ATR objective (Ge-crystal). FIG. 5 shows ATR FTIR spectra of presynthesized P3HT and photochemically synthesized PT infiltrated in $TiO_2$ nanotubes. The peaks at about 825 cm$^{-1}$ and about 1052 cm$^{-1}$ are associated with $\delta_{CH}$ out-of-plane bending vibration and the $\delta_{CH}$ in-plane bending vibration, respectively, while the peaks at about 3050-3100 cm$^{-1}$ are assigned to the VCH stretching vibration at the 3 and 4 positions of the thiophene ring. These results indicate that the thiophene ring structure is intact upon photodissociation of the C—I bond and that the coupling reactions occur at the α positions from the sulfur atom. The single band at about 1510 cm$^{-1}$ is due to the C=C asymmetric ($v_{as}$) stretching vibration, which is observed in a narrow region of about 1530-1502 cm$^{-1}$ for oligothiophenes and polythiophenes. The peak at about 1450 cm$^{-1}$ and a shoulder at the lower wavelength side are attributed to the C=C symmetric ($v_s$) stretching vibration. This peak position is sensitive to the conjugation length in α-α'-coupled oligothiophenes. The C=C symmetric stretching band shifts to higher wavenumber with increasing conjugation length. Intensity ratio of symmetric and anti-symmetric peaks ($I_{asym}/I_{sym}$~0.3) and location of the C=C symmetric stretching vibration peak of the UV-produced film compared with those of P3HT indicate that the photosynthesized polymer film has similar conjugation length distribution (at least 8 conjugated thiophene ring units). The FTIR spectrum of the photochemically synthesized film shows no peak in the region of about 1650-1750 cm$^{-1}$, indicating that oxidation defects and contamination are negligible. The ATR FTIR spectra contain evidence for coupling of UV-polymerized thiophene to the $TiO_2$ surface: disappearance of a broad absorption band at about 3400 cm$^{-1}$, assigned to the stretching vibrations of O—H groups, and appearance of new peaks in the range of about 2000-2350 cm$^{-1}$ suggests structural changes in $TiO_2$ due to photoinduced interaction with the polymer.

Figure 6:
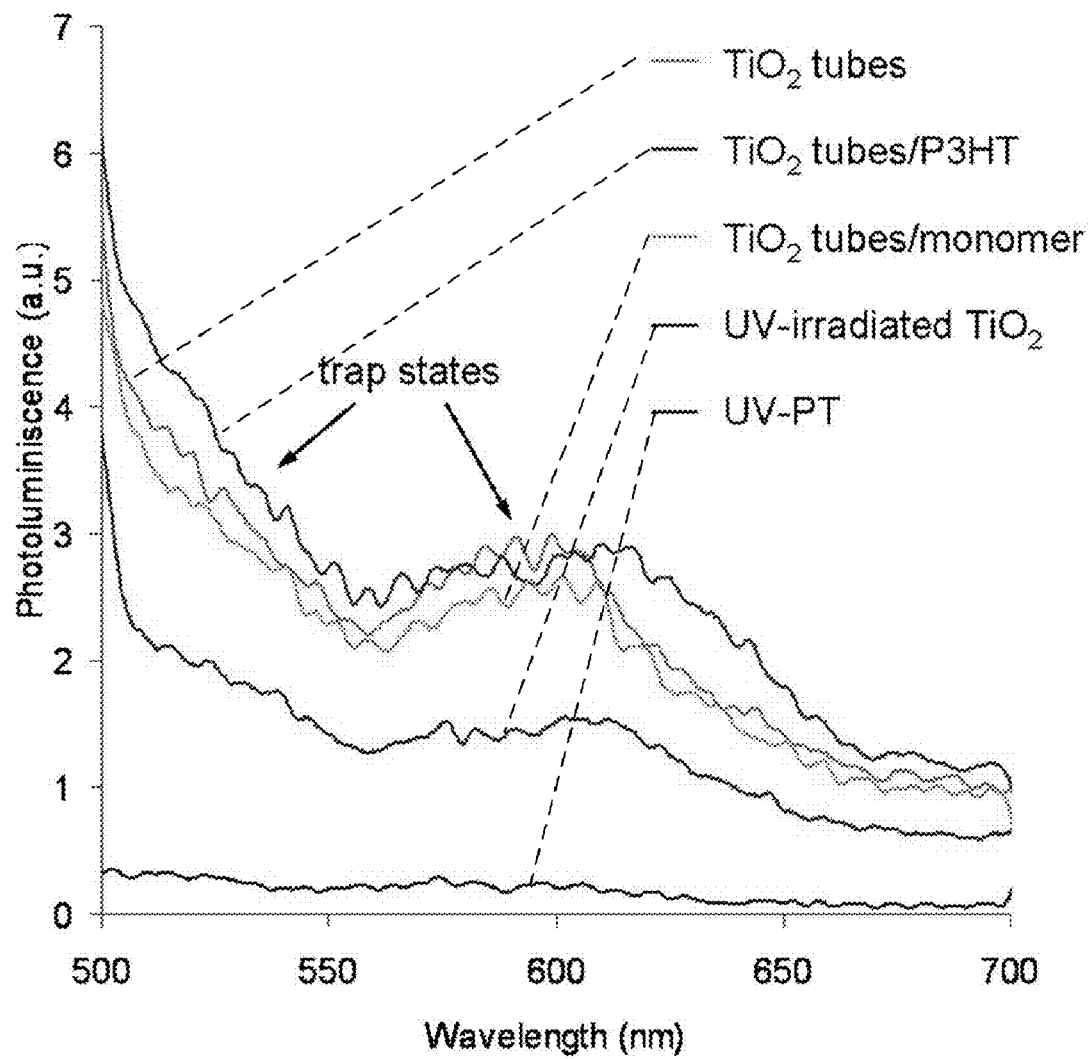
FIG. 6 shows a photoluminescence spectrum of $TiO_2$ surface state trap level quenching upon in situ UV polymerization and compares this to a conventional P3HT/$TiO_2$ system.

Photoluminescence (PL) spectra in FIG. 6 show trap states present on the surface of the TiO$_2$ nanotube array 100 prior to and after infiltration of (a) the DIT monomer or (b) P3HT. Upon UV irradiation of the TiO$_2$ nanotubes 110, a decrease in the intensity of the peak centered at 617 nm was observed. This is attributed to oxygen vacancies (intergap surface states), due to radical creation on the TiO$_2$ surface. After 15 minutes, these radicals recombine and UV-irradiated TiO$_2$ shows the same spectra as pre-irradiated TiO$_2$ tubes. The efficiency of charge transfer between the polymer and the titania is greatly enhanced using in situ polymerization. Complete PL quenching upon UV irradiation of the TiO$_2$ nanotube array 100 infiltrated with monomer precursor indicates an excited-state interaction between the two semiconductor materials and deactivation of the excited polythiophene via electron transfer to the TiO$_2$. Such quenching behavior suggests coupling between radicals created at the TiO$_2$ surface and from DIT via a charge transfer complex. The inability of the infiltrated P3HT to similarly quench photoluminescence indicates limitations to charge transfer processes at the TiO$_2$/polymer interface, which may result in decreased exciton separation effectiveness.

Figure 7A:
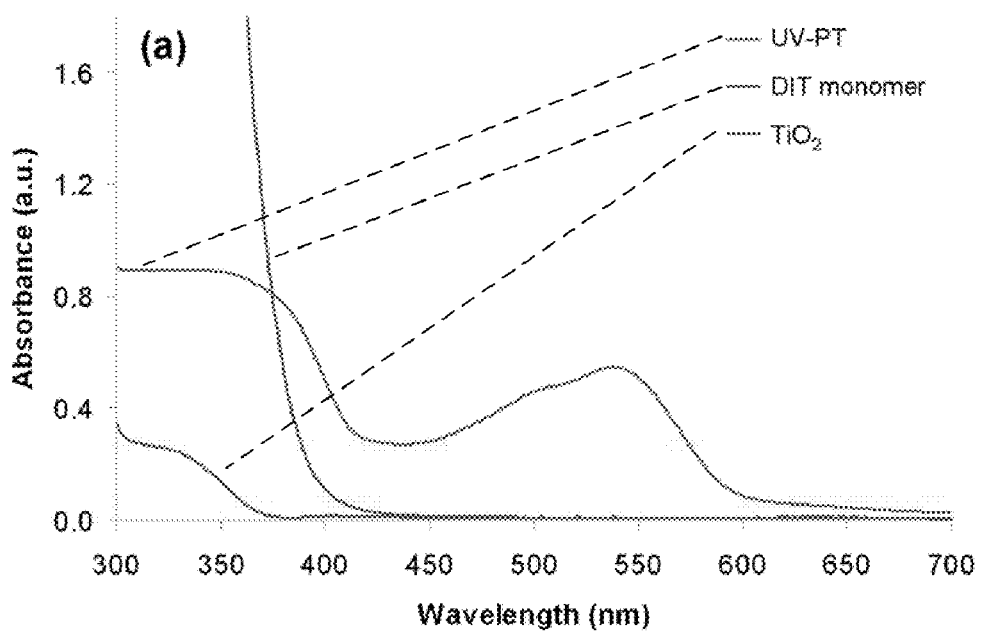
FIG. 7A shows absorption spectra of UV-polymerized polythiophene (after 15 minutes of UV irradiation), 2,5-diiodothiophene (DIT) monomer on glass, and a TiO$_2$ nanotube array.
Figure 7B:
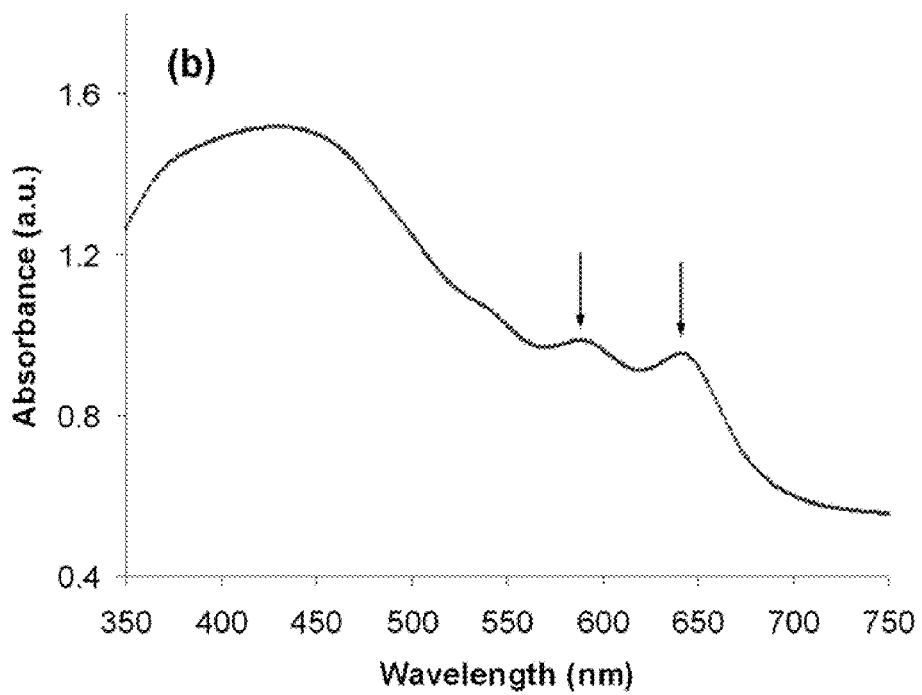
FIG. 7B shows analogous data on an ITO/TiO$_2$ substrate.

Further evidence of coupling between in situ polymerized PT and the TiO$_2$ nanotube surface is a qualitative difference in absorption spectra of polymer on glass (FIG. 7A) and on the TiO$_2$ surface (FIG. 7B). Absorption spectra of the UV-polymerized film on glass show signatures of oligothiophenes (peak near 500 nm) and polythiophene (peak at 545 nm). Analysis can be facilitated by comparison to data from ordered aggregates of P3HT in solution, for which the main $\pi$-$\pi$* absorption band is at 515 nm and two vibronic absorption shoulders are at 558 nm and 607 nm. The vibronic shoulder peak at 558 nm is attributed to absorptions of extended conjugation lengths resulting from the ordered packing of P3HT backbones, whereas the peak at 607 nm comes from the inter-chain transition of P3HT and its intensity is correlated to the degree of inter-chain order. Due to coupling with the TiO$_2$ surface and improved UV-PT crystallinity and $\pi$-$\pi$ stacking, absorption spectra of monomer polymerized inside TiO$_2$ nanotubes show a shift in both the main absorption peak position and in the two vibronic absorption peak positions (FIG. 7B). Also, a new peak appears centered near 650 nm, which, not to be limited by theory, may be indicative of a charge transfer complex.

When monomer precursor was UV-polymerized on a glass substrate, as depicted in FIG. 7A, i.e. with no TiO$_2$ present, the two vibronic absorption peaks are not resolved suggesting that the crystallinity and $\pi$-$\pi$ stacking of UV-PT is lower in the absence of TiO$_2$. Low crystalline order has been demonstrated to be a significant obstacle to achieving high performance devices based on crystallizable polymer. By using this relatively simple in situ UV polymerization method that couples the polymer to the TiO$_2$ surface and creates longer and inter-connected oligothiophene/polythiophene molecules, absorption of sunlight and enhanced charge carrier mobility of the photoactive layer may be accomplished.

The photo-electro performance of the device fabricated according to Example 1 was evaluated and compared against the reference device. Due to the Ti film 150 present between the ITO-coated glass substrate 140 and the TiO$_2$ nanotube array 100, standard front side device illumination was not possible. Consequently, to evaluate the photoelectrochemical response, the ITO/Ti/TiO$_2$(NT)/UV-PT/Ag architecture was illuminated from the backside, through the 30 nm-thick Ag top electrode 120. The thickness of the Ag top electrode 120 was optimized to balance the needs for optical transmittance and electrical conductivity. In the range from about 350 nm to about 700 nm, transmittance of the 30 nm-thick Ag top electrode 120 varies from 55% (350 nm) down to <10% (700 nm).

Photoelectrochemical studies were carried out with TiO$_2$/ITO as the working electrode and Ag as the counter/reference. For spectroelectrochemical measurements a BAS-100B/W (Bioanalytical Systems) workstation was used. The white light source was a 300 W xenon lamp (PerkinElmer). Monochromatic light was provided through a Jobin-Yvon grating monochromator. The density of the incident light (power lamp profile) was measured using a calibrated silicon diode detector (Ophir Optronics), the maximum power of 0.038 W/cm$^2$ at 520 nm was measured at the position of the electrodes. All experiments were carried out under ambient conditions.

Figure 8:
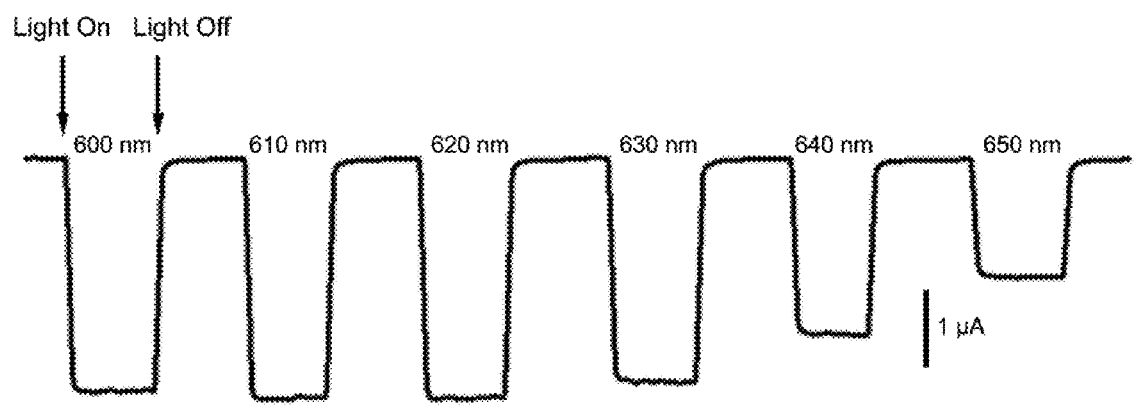
FIG. 8 is the change in photocurrent upon illumination (Light On-Light Off) in the 600 nm-650 nm range using the device of FIG. 4.
Figure 9:
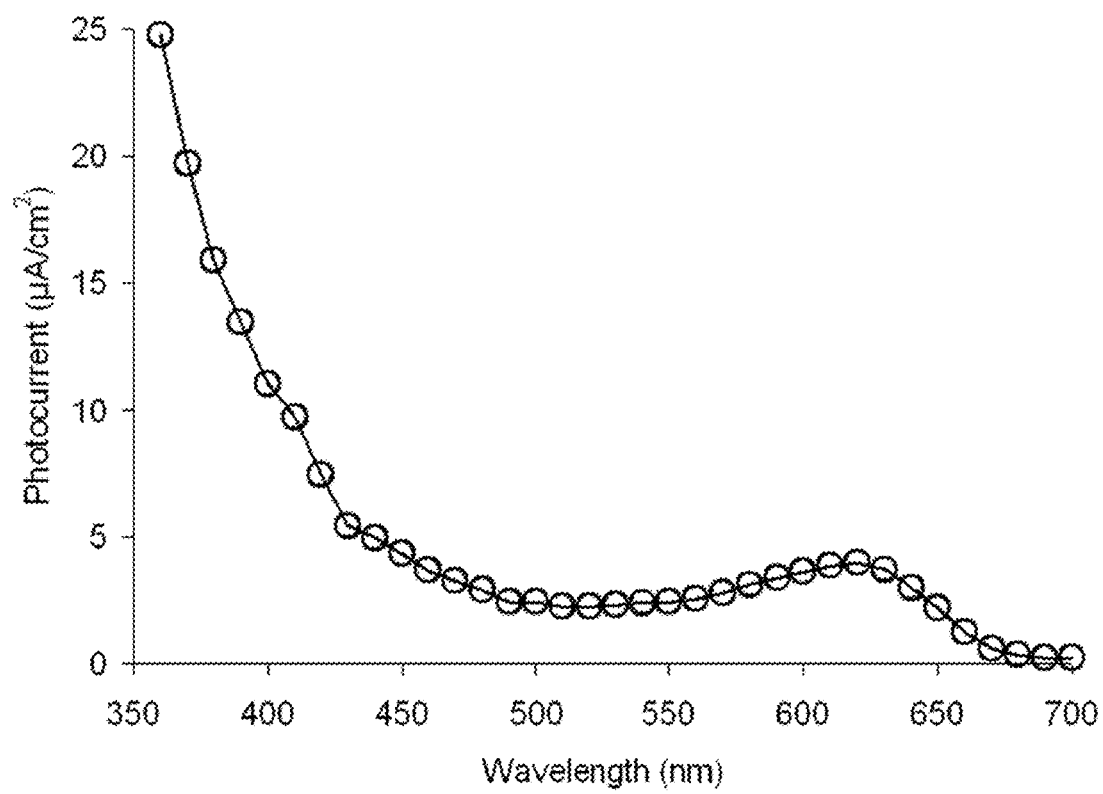
FIG. 9 is the photocurrent action spectrum of UV-polymerized PT (UV-PT) recorded in terms of incident photon to generated photocurrent.
Figure 10:
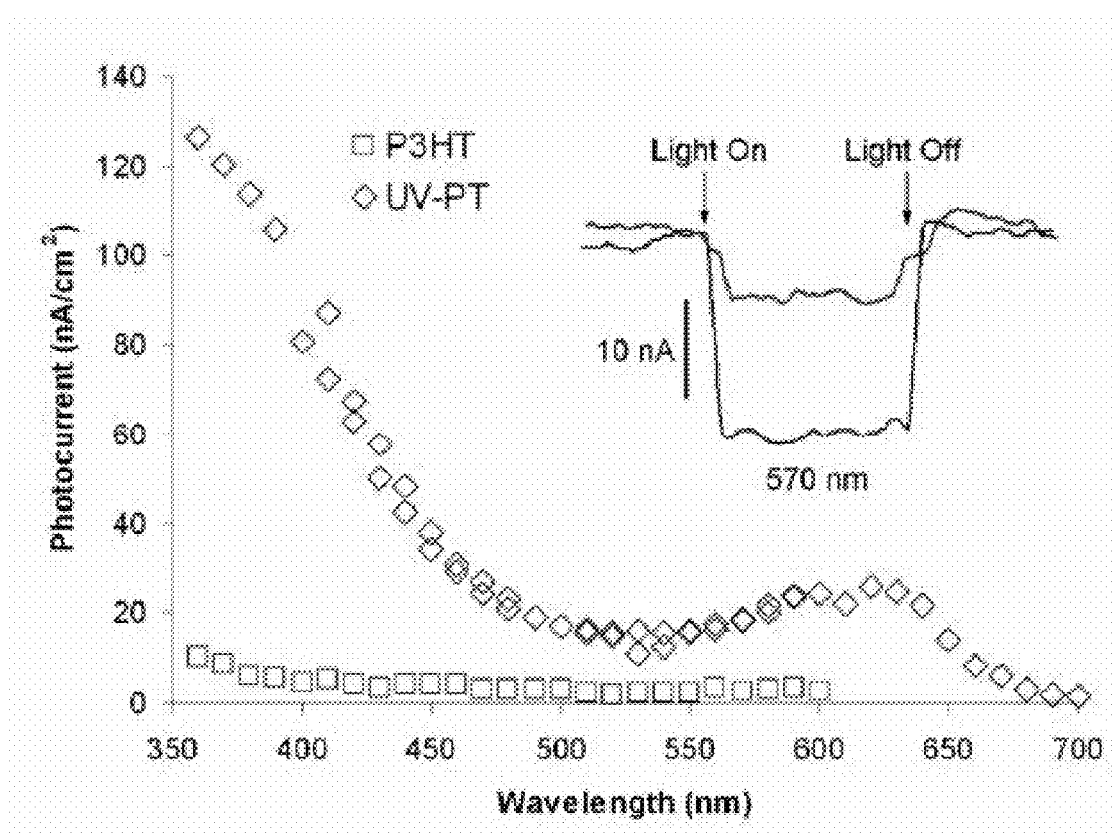
FIG. 10 is the photocurrent action spectrum of UV-polymerized PT (UV-PT) and a conventional P3HT/TiO$_2$ system recorded in terms of incident photon to generated photocurrent in which the two devices were fabricated to contain the same amount of thiophene polymer.

The photoelectrochemical behavior of the ITO/TiO$_2$(NT)/UV-PT/Ag device is presented in terms of photocurrent response. As shown in FIG. 8, upon illumination with visible light, prompt generation of anodic current was observed. A non-ideal backside-illuminated setup (with the Ag top electrode 120 optical transmittance of <10%) under illumination of a 620 nm light surprisingly yields a photocurrent density as high as 5 WA/cm$^2$. As illustrated in FIG. 10, compared to the reference device infiltrated with pre-synthesized P3HT, the UV-PT cell provided more than a 100 percent increase in photocurrent at certain wavelengths. Furthermore, during the light exposure step (Light On) in the 600-650 nm range, flat photocurrent values show that charge recombination and space charging during hole transport through the polymer are negligible. FIG. 9 shows the photoaction spectrum of the UV-PT.

The device according to the Example acts as a solid state non-electrochemical version of a dye-sensitized Grätzel cell: the anode and the cathode serve only as quasi-ohmic contacts and the internal field originates from the difference between the Fermi level of the TiO$_2$ and the HOMO of the conducting polymer. Because the energy level of the conduction band of the TiO$_2$ semiconductor is low, large open circuit and low saturation voltages can be achieved using stable, high workfunction electrodes, allowing for flexibility in improving device efficiency, cost, and stability.

In order to increase transmission through the top electrode and overall cell performance for the ITO/Ti/TiO$_2$(NT)/UV-PT/Ag architecture, a thinner layer of Ag can be used. For example, cutting the thickness of the Ag layer in half increases the transmission by a factor of four. Another possible architecture for backside illumination would be Ti/TiO$_2$(NT)/UV-PT/ITO, that is, with transparent ITO as the top electrode. In a preferred embodiment, the TiO$_2$ nanotube depth would be engineered to be just shy of the initial Ti layer thickness, rendering this part of the device transparent and hence enabling front side illumination. Another preferred embodiment would be to prepare nanotubes or nanorods of optimal height and then delaminate the oxide nanostructures from the metal substrate and deposit them onto a transparent electrode. Because the backside architecture illuminated the cell through the Ag top electrode 120, there is a possibility for Ag plasmon-enhanced solar energy conversion. When light is absorbed in the photoactive layer, dipole-allowed photogeneration of excitons scale with the electric field squared. It has been shown that by enhancing the local electromagnetic field with the inclusion of surface-plasmon active materials, it is possible to enhance the photogeneration of excitons in the polymer. Enhancements to the photogeneration of excitons would lead to higher photocurrents from wavelengths near the plasmon resonance and into the red. Note, however, that in the present device when the photoaction spectrum (FIG. 9) and absorption spectrum (FIG. 7B) of the UV-polymerized device are compared, both vibronic absorption peaks are photoactive and responsible for the hole transfer process through the polymer.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A hybrid photovoltaic cell device for generating electrical energy, comprising:
   a composite substrate for receiving solar radiation comprising:
      a first surface;
      a second surface disposed substantially opposite the first surface,
      an electron-accepting material characterized by a plurality of nanoscopic holes; and
      an organic electron-donating material disposed within at least some of the plurality of nanoscopic holes;
   an electrically conductive substrate proximate the first surface, the electrically conductive substrate in electrical communication with the composite substrate; and
   an electrode proximate the second surface, the electrode in electrical communication with the composite substrate,
   wherein the organic electron-donating material comprises a conjugated polymer wherein the organic electron-donating material comprises a plurality of two or more layers of conjugated polymer with each of the conjugated polymer layers having a different polymer length and a first layer of the conjugate polymer having a longest polymer length and a smallest optical bandgap and the other of the two or more layers having incrementally larger optical bandgaps and associated shorter polymer length.

2. The hybrid photovoltaic cell of claim 1, wherein the electron-accepting material plurality of nanoscopic holes comprises a nanotube array having a surface and characterized by a plurality of nanotubes, and wherein the organic electron-donating material is disposed within the at least some of the plurality of nanotubes.

3. The hybrid photovoltaic cell of claim 2, wherein the nanotube array comprises a plurality of metal oxide nanotubes.

4. The hybrid photovoltaic cell of claim 3, wherein the nanotube array comprises a plurality of substantially ordered $TiO_2$ nanotubes.

5. The hybrid photovoltaic cell of claim 2, wherein each of the plurality of nanotubes has a radius from about 100 percent to about 200 percent of a distance characterized by the exciton diffusion distance.

6. The hybrid photovoltaic cell of claim 1, wherein the one or more precursors are at least in part polymerized through irradiation by ultraviolet light.

7. The hybrid photovoltaic cell of claim 1, wherein at least one of the one or more precursors comprises a thiophene, vinylene, phenylene, aniline, quinoline, quinoxaline, thienothiophene, and combinations thereof.

8. The hybrid photovoltaic cell of claim 7, wherein at least one of the precursors comprises 2,5-diiodothiophene.

9. The hybrid photovoltaic cell of claim 1, wherein the conjugated polymer comprises polythiophene and oligothiophene.

10. The hybrid photovoltaic cell of claim 1, wherein the organic electron-donating material further comprises a conjugated oligomer.

11. The hybrid photovoltaic cell of claim 2, wherein the device is comprised of a conjugated polymer electronically bonded to the nanoscopic holes of the nanotube array.

* * * * *